US011824028B2

(12) United States Patent
Ory et al.

(10) Patent No.: US 11,824,028 B2
(45) Date of Patent: Nov. 21, 2023

(54) DIE WITH METAL PILLARS

(71) Applicant: STMICROELECTRONICS (TOURS) SAS, Tours (FR)

(72) Inventors: Olivier Ory, Tours (FR); Christophe Lebrere, Artannes sur Indre (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 17/458,070

(22) Filed: Aug. 26, 2021

(65) Prior Publication Data
US 2022/0068866 A1    Mar. 3, 2022

(30) Foreign Application Priority Data
Sep. 3, 2020   (FR) ........................... 2008948

(51) Int. Cl.
*H01L 25/10*        (2006.01)
*H01L 23/00*        (2006.01)
(52) U.S. Cl.
CPC .............. *H01L 24/16* (2013.01); *H01L 24/11* (2013.01); *H01L 24/13* (2013.01); *H01L 24/81* (2013.01); *H01L 25/105* (2013.01); *H01L 2224/11916* (2013.01); *H01L 2224/13111* (2013.01); *H01L 2224/13139* (2013.01); *H01L 2224/13144* (2013.01); *H01L 2224/13147* (2013.01); *H01L 2224/16225* (2013.01); *H01L 2224/8185* (2013.01); *H01L 2224/81801* (2013.01)

(58) Field of Classification Search
CPC ........ H01L 25/105; H01L 24/13; H01L 24/81
See application file for complete search history.

(56) References Cited

U.S. PATENT DOCUMENTS 9,123,763 B2 *   9/2015  Yu ..................... H01L 21/76802
2008/0136004 A1 *  6/2008  Yang ..................... H01L 24/96
                                                                438/109

FOREIGN PATENT DOCUMENTS

WO        2011/131519 A1    10/2011

* cited by examiner

*Primary Examiner* — Dale E Page
*Assistant Examiner* — Wilner Jean Baptiste
(74) *Attorney, Agent, or Firm* — SEED IP LAW GROUP LLP (57) ABSTRACT

The present disclosure relates to a die comprising metal pillars extending from a surface of the die, the height of each pillar being substantially equal to or greater than 20 μm, the pillars being intended to raise the die when fastening the die by means of a bonding material on a surface of a support. The metal pillars being inserted into the bonding material at which point the bonding material is annealed to be cured and hardened solidifying the bonding material to couple the die to the surface of the support.

19 Claims, 5 Drawing Sheets

DIE WITH METAL PILLARS

BACKGROUND

Technical Field

The present disclosure relates to an electronic chip or die and to a method of manufacturing the same. The electronic chips or die may be assembled in flat integrated circuits with no leads (for example, of QFN, Quad Flat No Leads, package type and DFN, Dual-Flat No-leads, package type), which physically couple the electronic chips or die to a printed circuit.

Description of the Related Art

A die is fastened to a flat integrated circuit package with no leads by a layer of a bonding material, for example, a glue or solder layer. The die is generally pressed against the package during the fastening of the die to the package to adhere the layer of the bonding material to the die. During this operation, bonding material may rise up onto the sides of the die. For certain applications, there is a need for dies assembled in flat integrated circuit packages with no leads for which the bonding material does not rise up on the sides of the die.

BRIEF SUMMARY

One embodiment provides a die comprising at least three metal pillars extending from a surface of the die, the height of each pillar being substantially equal to or greater than 20-micrometers (μm), the pillars being intended to raise the die during a fastening of the die, by the said surface, by means of a bonding material on a surface of a support.

According to an embodiment, each pillar extends outside of the die along a height in the range from 20 μm to 150 μm, preferably from 50 μm to 100 μm.

According to an embodiment, the pillars cover from 30% to 50% of the surface area of the die intended to be opposite said surface of the support.

According to an embodiment, the pillars comprise copper, silver, tin, or gold.

According to an embodiment, the pillars comprise an alloy of tin and silver.

According to an embodiment, the bonding material is epoxy glue.

According to an embodiment, the bonding material is solder paste.

According to an embodiment, the die is bidirectional.

One embodiment provides an electronic device comprising at least one die as described and a package.

According to an embodiment, the electronic device comprises a single die assembled on the package.

According to an embodiment, the electronic device comprising a stack of at least two dies, the stack being assembled on the package.

One embodiment provides a method of manufacturing the die as described comprising the successive steps of:
  forming, on the upper surface side of a semiconductor substrate, inside and on top of which a plurality of integrated circuits have been previously formed, a layer of organic resist;
  forming, from the upper surface of the substrate, openings extending in the organic resist layer;
  forming metal pillars in said openings; and
  removing the organic resist layer.

According to an embodiment, the forming of the metal pillars is performed by electrolytic growth.

One embodiment provides a method of assembly of the die as described on the surface of the support, comprising the successive steps of:
  depositing the bonding material on the surface of the support;
  positioning the die opposite the bonding material so that the pillars are located opposite the bonding material; and
  bringing the die and the support together so that the pillars crush the bonding material.

According to an embodiment, the assembly method comprises a step of annealing the bonding material at the end of the step of bringing the die and the support together.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like reference numerals in the various figures. In particular, the structural and/or functional features that are common among the various embodiments may have the same reference numerals and may dispose identical structural, dimensional and material properties.

For the sake of clarity, only the steps and elements that are useful for an understanding of the embodiments described herein have been illustrated and described in detail. In particular, the embodiments have been described in relation with an example of a die. However, they may be easily adaptable to different examples of dies.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, the term "die" or "electronic chip" designates a small piece resulting from the cutting of a semiconductor wafer and having had at least one electronic component formed thereon. A die may comprise a single electronic component, for example, a diode used for the protection against electrostatic discharges, or a plurality of electronic components forming an integrated circuit.

Figure 1:
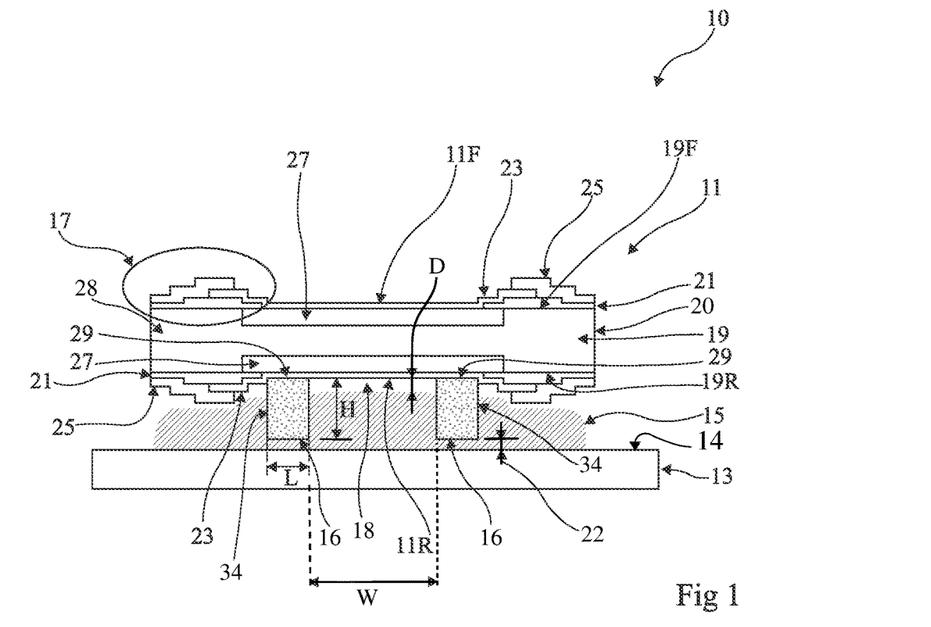
FIG. 1 shows, in a cross-section view, an embodiment of a die assembled to a package.
Figure 2:
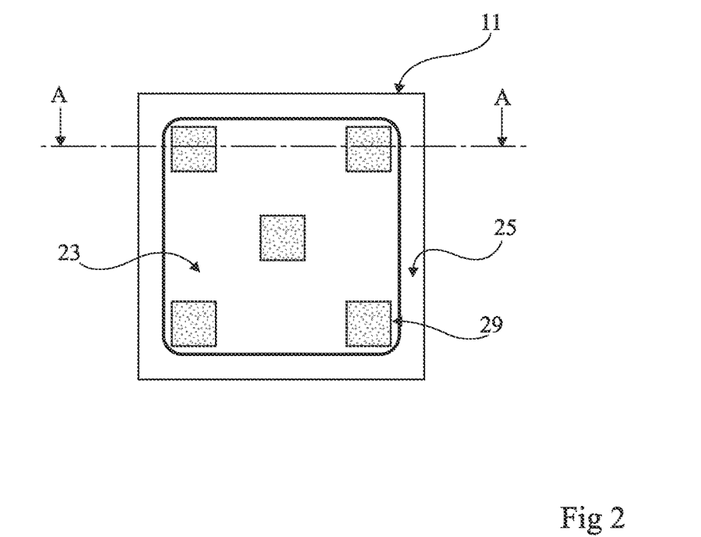
FIG. 2 shows, in a top view, the die illustrated in FIG. 1.

FIG. 1 is a partial simplified cross-section view of an embodiment of an electronic device 10 comprising an electronic die 11 assembled to a flat integrated circuit package with no leads. FIG. 2 is a partial simplified top view of the die 11 of FIG. 1.

In this embodiment, die 11 is fastened to a support 13 of a flat integrated circuit package with no leads, only partially shown in FIG. 1, by means of a layer 15 of a bonding material, for example, a glue layer or drop or a solder layer or drop. Support 13 may be a die pad, a frame, a support, or some other type of structure to which die 11 is coupled by layer 15, the details of which will be described later herein.

The bonding material is, for example, epoxy glue or solder paste. The bonding material is, for example, an adhesive or some other type of material for bonding the die to surface 14 of support 13.

Die 11 comprises a front surface 11F and a rear surface 11R, opposite to front surface 11F, and facing support 13.

The die 11 illustrated in FIG. 1 has, for example, in top view, the shape of a square or of a rectangle. As a variation, die 11 has, in top view, any shape.

According to the embodiment illustrated in FIG. 1, die 11 comprises a semiconductor substrate 19. Substrate 19 comprises two buried regions 27 respectively flush with an upper surface 19F and a lower surface 19R of substrate 19. Outside of buried regions 27 of substrate 19 is a core 28 of substrate 19.

According to the embodiment illustrated in FIG. 1, the core 28 of substrate 19 is made of a material of a first conductivity type, for example, of type n. Regions 27 are made of a material of a second conductivity type, for example, of type p, different from the first conductivity type.

Regions 27 are preferably located respectively at the center of the upper surface 19F of substrate 19 and at the center of the lower surface 19R of substrate 19.

Substrate 19 then, for example, comprises alternately p-, n-, and p-doped layers, which define two diodes connected to a common cathode.

According to the embodiment illustrated in FIG. 1, die 11 further comprises, on each of the edges of its front and rear surfaces 11F and 11R, a stack 17 positioned on or under semiconductor substrate 19. More particularly, die 11 comprises a stack 17 on the edge(s) of its rear surface 11R and an identical stack 17 on the edge(s) of its front surface 11F.

According to an embodiment, die 11 is a bidirectional die, that is, each of its front and rear surfaces 11F, 11R comprises an area which, in operation, is at a potential different from the potential of the core 28 of substrate 19.

The stack 17 located on the side of upper surface 19F will now be described, knowing that the stack 17 located on the side of lower surface 19R has a similar structure. Stack 17 comprises, according to the embodiment illustrated in FIG. 1:

a dielectric layer 21, for example, made of oxide, on top and in contact with upper surface 19F of substrate 19 and extending over a portion of this surface, layer 21 extending over a peripheral portion of upper surface 19F and not on the central portion of upper surface 19F;

a conductive layer 23, for example, metallic, extending over the central portion of upper surface 19F exposed by layer 21, in contact with the central portion of upper surface 19F and extending over the inner edge of layer 21; and a dielectric layer 25 which covers the periphery of layer 23 and the portion of layer 21 which is not covered with layer 23, and which does not cover the central portion of layer 23.

Regions 27 are for example each covered with layer 23, preferably in contact with layer 23, and with a portion of layer 21.

According to the embodiment illustrated in FIG. 1, layer 23 is monoblock, that is, it is not divided into a plurality of blocks. A homogeneous potential can thus be applied in operation to the entire layer 23.

As a variation, layer 23 is fragmented and the different pieces of layer 23 may be driven at different potentials.

Die 11 further comprises metal pillars 29 located on the side of die 11 at which rear surface 11R is present, and metal pillars 29 located on top of and in contact with layer 23 and opposite regions 27. In FIG. 2, five pillars 29 have been shown. However, in practice, the number of pillars may be different from five (e.g., greater than five or less than five). The number of pillars 29 is preferably greater than three. The number of pillars is preferably determined so that from 30% to 50% of a surface area of the rear surface 11R of die 11 are covered with pillars 29.

If layer 23 is fragmented, for each piece of layer 23, at least one pillar 29 is formed opposite and in contact with the piece of layer 23.

Each pillar 29 has, for example, in top view, a square or rectangular shape, which may readily be seen in FIG. 2. As a variant, the pillars may have other shapes, for example, a circular shape or an irregular shape.

As an example, each pillar 29 has a width L measured in a plane parallel to rear surface 11R of die 11. Width L corresponds to the diameter of the circle inscribed within the cross-section of the pillar. Width L corresponds to the diameter of the cross-section of a pillar 29 in the case of circular pillars 29 or to the length of a side of the cross-section of a pillar 29 in the case of pillars 29 with a square cross-section. Width L is preferably in the range from 40 micrometers (μm) to 100 μm, preferably in the order of 60 μm. Width L is a first dimension extending in a direction directed from a left-hand side of support 13 to a right-hand side of support 13 based on the orientation of electronic device 10 as shown in FIG. 1.

Each pillar 29 extends along a height H measured from rear surface 11R of die 11 and along a direction transverse (e.g., perpendicular in this embodiment) to rear surface 11R of die 11. Height H is greater than 20 μm. Height H of pillars 29 is for example in the range from approximately 20 μm to 150 μm, preferably from 50 μm to 100 μm. Height H is a second dimension extending in a direction directed from rear surface 11R to surface 14 of support 13 based on the orientation of electronic device 10 as shown in FIG. 1. Height H extends from rear surface 11R of die 11 to end surfaces 16 of the plurality of pillars.

Pillars 29 may have a monolayer or multilayer structure. Pillars 29 may be made up of copper, tin, silver, or gold, for example of a tin and silver alloy (SnAg). As an example, each pillar 29 comprises a copper-based layer covered with a layer of an alloy of tin and silver.

Pillars 29 are preferably located on rear surface 11R of die 11 symmetrically with respect to an axis running through the center of rear surface 11R and orthogonal to this same surface.

As an example, if the rear surface 11R of die 11 is polygonal, for example, square, rectangular, or n-sided polygon (e.g., n-gon shape), and has a plurality of corners, there is at least one pillar 29 per corner of rear surface 11R of die 11.

At least some of pillars 29 are in contact with bonding material 15. Preferably, all pillars 29 are in contact with the bonding material 15. In the embodiment illustrated in FIGS. 1 and 2, a film of the bonding material 15 is present between each pillar 29 and support 13 so that pillars 29 are not in direct contact with support 13. In other words, end surfaces 16 of pillars 29 are spaced apart from surface 14 of support 13. End surfaces 16 of pillars 29 may be spaced apart from surface 14 of support 13 by a height 22 (e.g., dimension), which extends in a direction directed from the surface 14 of support 13 to end surfaces 16 of pillars 29. In this embodiment, bonding material 15 does not contact sidewalls 20 of die 11 and is spaced apart from rear surface 11R of die 11. For example, in this embodiment, a gap 18 extends from bonding material 15 to rear surface 11R of the die between pillars 29 as shown in FIG. 1. The gap 18 having a width W greater than width L of each pillar 29. The width W extending in a direction extending between adjacent ones of the plurality of pillars. The gap having a height D spacing the bonding material 15 from the rear surface 11R of the die 11. The height D being less than the width L of the pillars 29.

The bonding material 15 partially covers sidewalls 34 of the pillars 29. In this embodiment as shown in FIG. 1, the bonding material 15 covers a majority of the sidewalls 34. However, in some alternative embodiments, the bonding material may not cover a majority of the sidewalls 34.

According to another embodiment, at least some of the pillars are in direct contact with support 13. In other words, end surfaces 16 of pillars 29 are in contact with surface 14 of the support 13.

The assembly of die 11 on support 13 of the package may be performed by arranging the bonding material on support 13 at the desired location of die 11 and by applying die 11 against support 13 at this location, the pillars 29 of die 11 facing support 13.

An advantage of the present embodiment is that the present embodiment enables containment of the bonding material under the die 11 during the package assembly, and, thus, die 11 is on support 13 of the package without the bonding material rising up on the lateral edges of die 11. This enables to decrease risks of die failure. The structure obtained is a stilts-type structure.

FIGS. 3 to 12 are partial simplified cross-section views of structures obtained at successive steps of another embodiment of a method of manufacturing the electronic device illustrated in FIG. 1.

Figure 3:
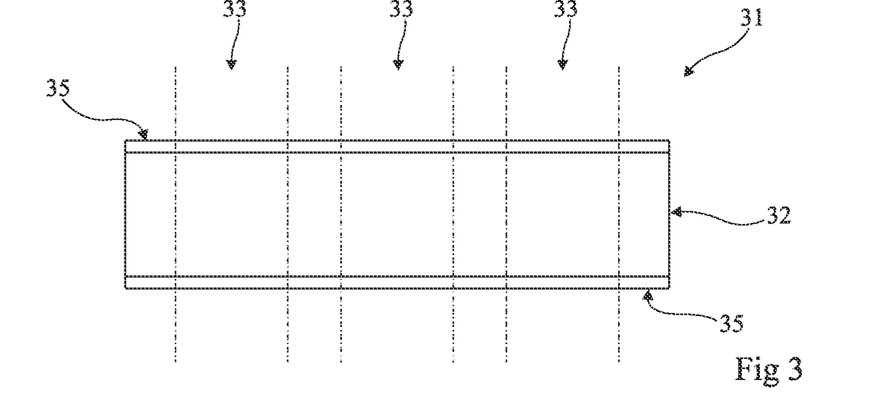
FIG. 3 shows, in a cross-section view, a step of an embodiment of a method of manufacturing the die illustrated in FIG. 1.

FIG. 3 is a cross-section view of an initial structure 31 comprising a semiconductor wafer 32 or a piece of a semiconductor wafer having had integrated circuits 33 previously formed inside and on top thereof. Circuits 33 are, for example, all identical, to within manufacturing tolerances.

Wafer 32, for example, has a thickness in the range from 300 μm to 900 μm, for example, a thickness of approximately 725 μm.

The structure 31 of FIG. 3 further comprises a stack of insulating and conductive layers 35 coating the upper and lower surfaces of wafer 32, which is an interconnection stack, where elements of interconnection of the components of each circuit 33 may be formed. The interconnection stack particularly comprises, for each integrated circuit 33, one or a plurality of metal contact pads, not shown, flush with the upper surface of the integrated circuit and intended to be connected to an external device. Stack 35 preferably comprises, for each circuit 33, the layers 21, 23, and 25 illustrated in FIG. 1.

Each integrated circuit 33, for example, comprises one or a plurality of electronic components (transistors, diodes, thyristors, triacs, etc.).

In FIG. 3, three integrated circuits 33 have been shown, it being understood that, in practice, the number of integrated circuits 33 formed inside and on wafer 32 may be different from three (e.g., greater than three or less than three).

As an example, structure 31 is supported by a support film, not shown, enabling to manipulate the structure 31.

Figure 4:
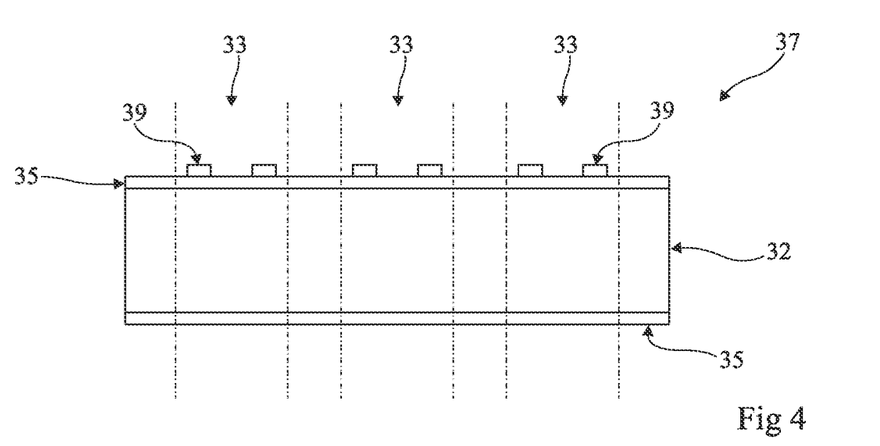
FIG. 4 illustrates another step of the method.

FIG. 4 shows a structure 37 obtained at the end of the forming of metal interface layers 39 at the surface of the structure 31 illustrated in FIG. 3. Each interface layer 39, for example, forms a UBM-type stack (Under Bump Metallization) or structure.

In FIG. 4, two UBMs 39 have been shown per circuit 33, it being understood that in practice, the number of UBMs 39 formed per circuit 33 may be different from two (e.g., greater than or less than two).

FIGS. 5 to 8 illustrate steps of the forming of metal connection pillars 29 on top of and in contact with UBMs 39.

Figure 5:
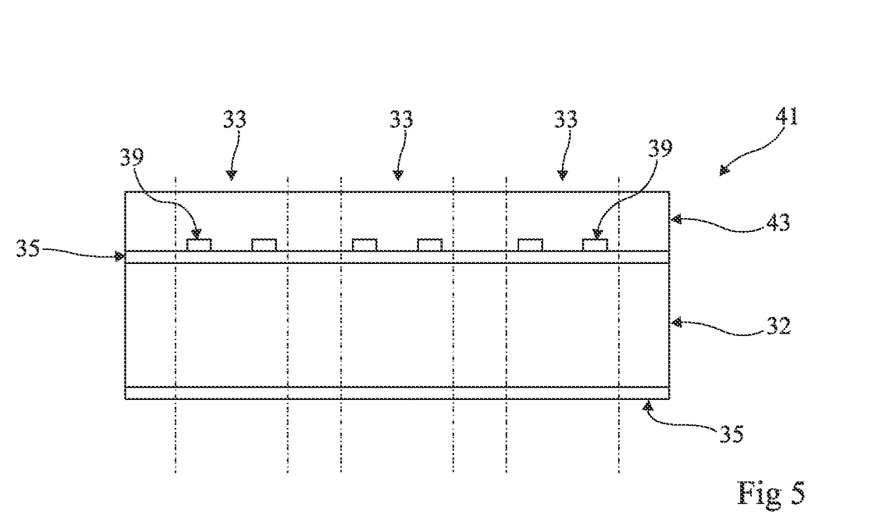
FIG. 5 illustrates another step of the method.

FIG. 5 shows a structure 41 obtained at the end of the deposition of a layer of resist 43, for example, organic, on the upper surface of the structure 37 illustrated in FIG. 4.

Layer 43 is deposited, preferably full plate, that is, it is deposited over the entire upper surface of the structure 37 illustrated in FIG. 4. Layer 43 has a thickness preferably greater than or equal to the desired height of pillars 29. Preferably, the thickness of layer 43 is in the range from 20 μm to 150 μm, more preferably in the range from 50 μm to 100 μm.

Figure 6:
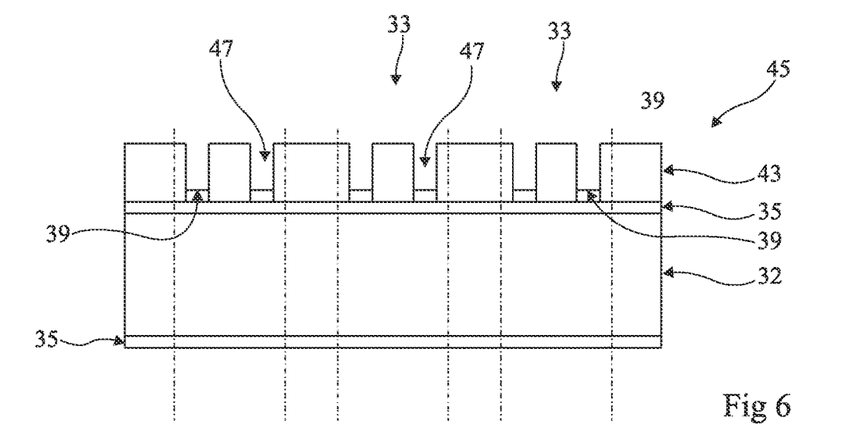
FIG. 6 illustrates another step of the method.

FIG. 6 illustrates a structure 45 obtained at the end of a step of photolithography of layer 43 of the structure 41 illustrated in FIG. 5. The photolithography particularly comprises the local exposure to layer 43 to a radiation, for example, UV rays. According to whether the resist forming layer 43 is positive or negative, the resist portions which are exposed to the radiation or the resist portions which are not exposed to the radiation are removed, for example, by means of a development solution.

At the end of the photolithography step, structure 45 comprises non-through openings 47. Openings 47 have the same cross-section in a plane parallel to the rear surface 11R of die 11 as that which is desired for the pillars. Further, each opening 47 exposes a UBM 39.

Figure 7:
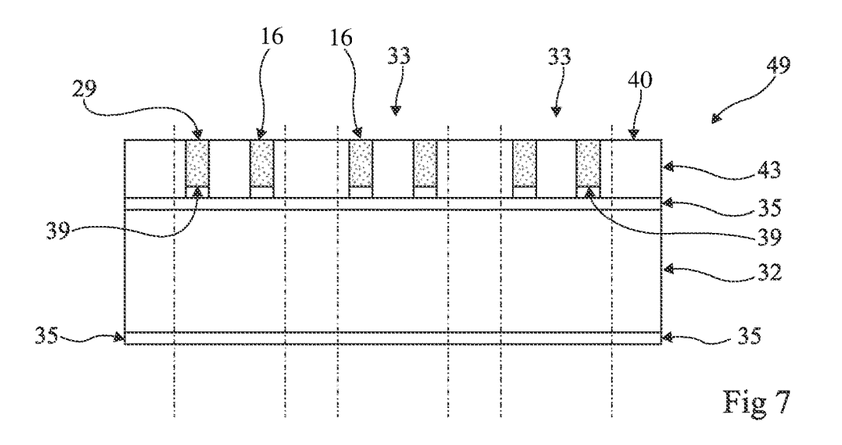
FIG. 7 illustrates another step of the method.

FIG. 7 illustrates a structure 49 obtained at the end of the forming of pillars 29 in the openings 47 of the structure 45 illustrated in FIG. 6.

A pillar 29 is formed on each UBM 39 and in each opening 47. Each pillar 29, for example, extends, in top view, over the entire surface of the underlying UBM 39. Pillars 29 may, for example, be formed by electrolytic growth. Pillars 29 include end surfaces 16 substantially coplanar and flush with a surface 40 of layer 43.

Figure 8:
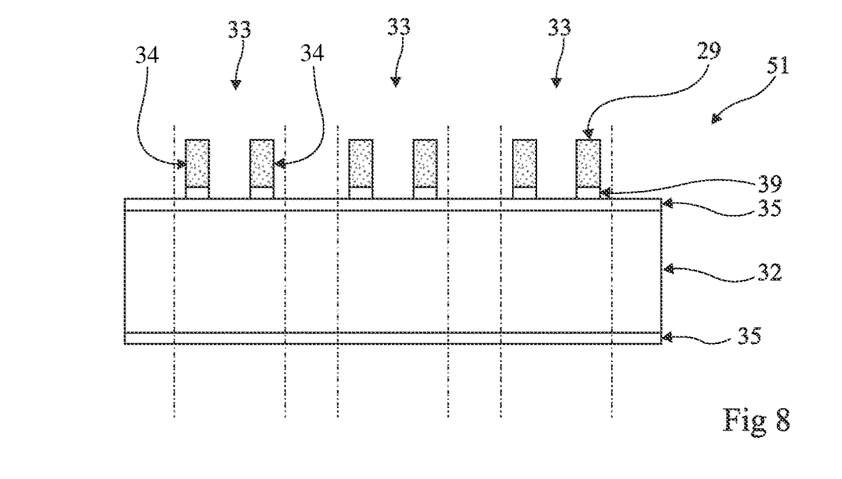
FIG. 8 illustrates another step of the method.

FIG. 8 illustrates a structure 51 obtained at the end of the removal of the layer 43 of the structure 49 illustrated in FIG.

7. The removal of layer 43 is for example performed by dissolution of the material forming layer 43 in a development solution. The removal of layer 43 exposing sidewalls 34 of pillars 29.

Figure 9:
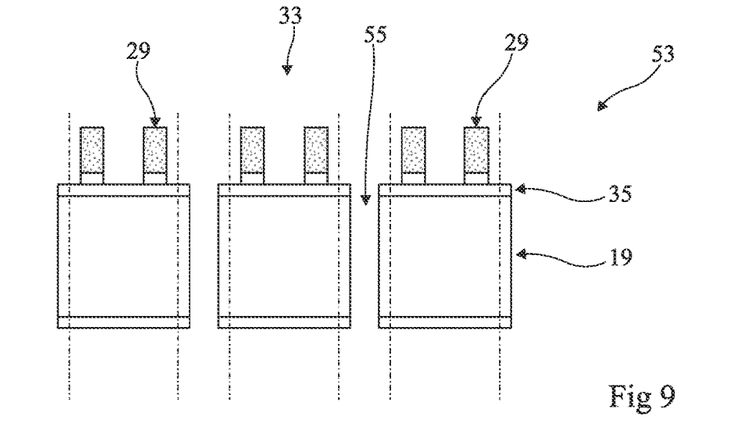
FIG. 9 illustrates another step of the method.

FIG. 9 illustrates a structure 53 obtained at the end of a step of cutting, for example, by sawing, for example mechanical, or by plasma cutting, of the structure 51 illustrated in FIG. 8 into individual dies, each comprising a single integrated circuit 33.

For this purpose, through trenches 55 are formed in structure 51. Trenches 55 extend vertically from the upper surface of structure 53 to the lower surface of structure 53.

At the end of this step, the obtained structure 53 corresponds to a plurality of dies, identical to the die 11 illustrated in FIG. 1, only connected by the support film, not shown. In particular, each cut piece of wafer 32 corresponds to the previously-described substrate 19.

Dies 11 may then be removed from the support film, not shown, for their assembly in an external device.

Figure 10:
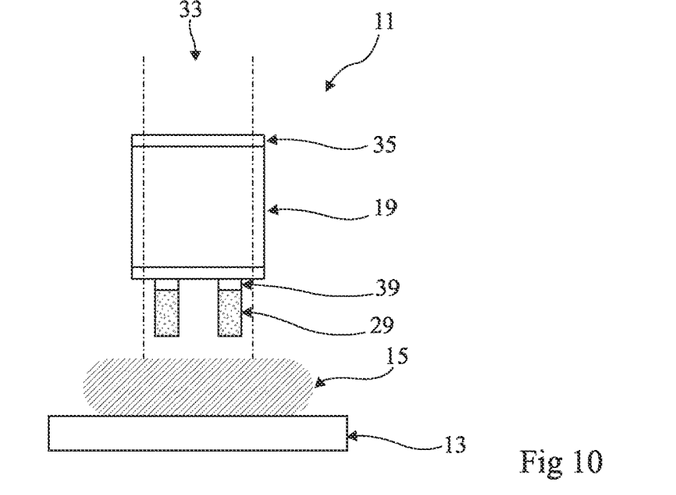
FIG. 10 illustrates another step of the method.
Figure 11:
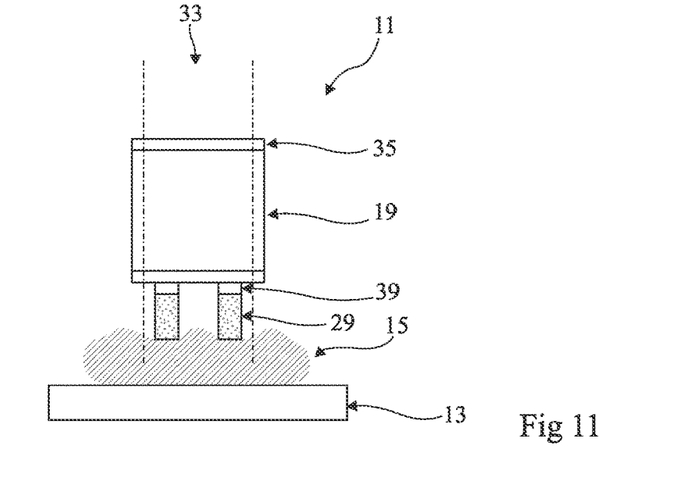
FIG. 11 illustrates another step of the method.
Figure 12:
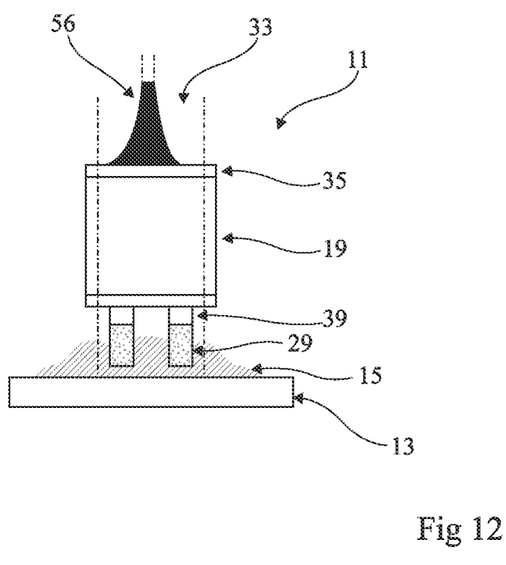
FIG. 12 illustrates another step of the method.

FIGS. 10 to 12 illustrate the step of assembly of die 11 in an external device and more particularly on support 13 of the package.

More particularly, FIG. 10 illustrates a structure during the step of assembly of the die 11 illustrated in FIG. 9 on support 13 of the package and FIG. 11 illustrates a structure obtained at the end of this assembly step.

It should be noted that in the example of FIGS. 10 and 11, the orientation of the die is inverted with respect to the cross-section views of FIGS. 3 to 9.

According to a first embodiment, during the step of assembly of die 11 on support 13 of the package, layer 15 of the bonding material, for example, a glue or solder drop, is deposited at the surface 14 of support 13 of the package. Layer 15 for example has a height in the order of 30 μm. Layer 15 is for example deposited by means of a syringe.

After the deposition of layer 15, die 11 is transferred onto support 13 of the package so that pillars 29 sink into layer 15 while pushing layer 15 back and apart. Particularly, when inserting pillars 29 into the layer, the sides of the pillars are at least partially covered by layer 15. In the case where the bonding material is glue, the entire structure illustrated in FIG. 11 is then submitted to an anneal to polymerize the glue and solidify the glue. The anneal is, for example, carried out at a temperature in the order of 200° C.

According to a second embodiment, during the step of assembly of die 11 on support 13 of the package, layer 15 of the bonding material, for example, a solder drop, is deposited at the surface 14 of support 13 of the previously-heated package. Layer 15, for example, has a height in the order of 30 μm. Layer 15 is, for example, deposited by means of a solid source of solder material, having an area placed into contact with support 13 of the package and which melts in contact therewith.

After the deposition of layer 15, die 11 is transferred onto support 13 of the package so that pillars 29 sink into layer 15 while pushing layer back onto the sides of pillars 29. Pillars 29 particularly play the role of spacers between the rear surface of die 11 and support 13 of the package, which enables to assemble die 11 on the support 13 of a package without for bonding material 15 to rise up on the lateral edges of die 11. This enables to decrease risks of die failure.

Die 11 is, after its transfer onto support 13, electrically coupled with one or more wires 56. Wires 56 couple, for example, the upper surface of die 11 (in the orientation of FIG. 12) to some connection elements (not shown) placed, for example, on the support 13.

Figure 13:
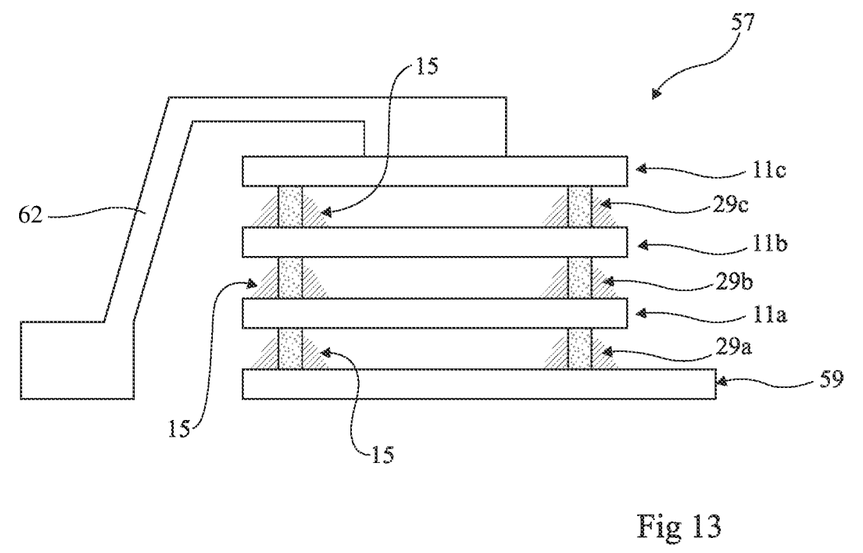
FIG. 13 shows, in a cross-section view, an example of assembly of a plurality of dies.

FIG. 13 shows, in a partial simplified cross-section view, an embodiment of an electronic device 57 comprising a plurality of dies 11.

More particularly, electronic device 57 may enable to form high-power components where individual dies 11 are stacked.

According to the embodiment illustrated in FIG. 13, electronic device 57 comprises a stack of three dies 11 bearing references 11a, 11b, and 11c, the stack being assembled on a support 59, which may be a die pad.

More particularly, in FIG. 13, die 11a is assembled on the upper surface of support 59 and connected thereto by pillars 29a fastened to support 59, die 11b is assembled on the front surface of die 11a and connected thereto by pillars 29b fastened to die 11a, and die 11c is assembled on the front surface of die 11b and connected thereto by pillars 29c fastened to die 11b.

As shown in FIG. 13, a conductive structure 62 is coupled to an upper surface of the die 11c at the top of the stacked die. The conductive structure 62 may be a lead structure.

The stacked configuration of the die 11a, 11b, 11c, the conductive structure 62, and the support 59 as shown in FIG. 13 may be covered and/or encased within a molding compound, an epoxy, or a resin to form a semiconductor package including the die 11a, 11b, 11c, the conductive structure 62, and the support 59.

According to an embodiment, the fastening of pillars 29c, 29b, and 29a respectively to dies 11b, 11a and to support 59 is performed by the melting of a tin and silver layer present at the surface of the pillars 29a, 29b, 29c. The molten metal placed into contact with dies 11b, 11a or support 59 and then cooled enables to obtain a rigid structure.

As a variant, each pillar 29a, 29b, 29c is fastened to the underlying layer by a bonding material, for example, an epoxy glue or a metallic solder paste.

An advantage of this embodiment is that this embodiment enables to assemble a plurality of dies while limiting the thickness of the final electronic device. Indeed, the use of dies provided with pillars enables to do away with the use of spacers having a thickness which may be greater than 400 μm in this type of assembly.

Another advantage of this embodiment is that it enables to increase the lifetime of the electronic device since the bonding material used for the assembly degrades slower in time than currently-used solders.

A die (11) may be summarized as including at least three metal pillars (29) extending from a surface of the die, the height (H) of each pillar being greater than 20 μm, the pillars being intended to raise the die during a fastening of the die, by the said surface, by means of a bonding material (15) on the wall (13) of a support.

Each pillar (29) may extend outside of the die (11) along a height (H) in the range from 20 μm to 150 μm, preferably from 50 μm to 100 μm.

The pillars (29) may cover from 30% to 50% of the surface area of the die (11) intended to be opposite said wall (13) of the support.

The pillars (29) may include copper, silver, tin, or gold.

The pillars (29) may include an alloy of tin and silver.

The bonding material (15) may be epoxy glue.

The bonding material (15) may be solder paste.

The die (11) may be bidirectional.

An electronic device may be summarized as including at least one die (11), and a package.

The electronic device may include a single die (11) assembled on the package.

The electronic device may include a stack of at least two dies (11), the stack being assembled on the package.

A method of manufacturing the die may be summarized as including the successive steps of: a) forming, on the upper surface side of a semiconductor substrate (32), inside and on top of which a plurality of integrated circuits (33) have been previously formed, a layer (43) of organic resist; b) forming, from the upper surface of the substrate (32), openings (47) extending in the organic resist layer (43); c) forming metal pillars (29) in said openings (47); and d) removing the organic resist layer (43).

The forming of the metal pillars (29) may be performed by electrolytic growth.

A method of assembly of the die (11) on the wall of the support, may be summarized as including the successive steps of: a. depositing the bonding material (15) on the wall (13) of the support; b. positioning the die (11) opposite the bonding material so that the pillars (29) are located opposite the bonding material; and c. bringing the die and the support together so that the pillars crush the bonding material.

The assembly method may include a step of annealing the bonding material (15) at the end of the step of bringing the die (11) and the support (13) together.

Various embodiments and variants have been described. Those skilled in the art will understand that certain features of these various embodiments and variants may be combined, and other variants will occur to those skilled in the art. In particular, the various embodiments have taken as an example a die comprising two diodes. However, these embodiments may apply to different electronic components.

Finally, the practical implementation of the described embodiments and variations is within the abilities of those skilled in the art based on the functional indications given hereabove.

The invention claimed is:

1. A device, comprising:
a die including:
a core having a sidewall;
a conductive layer on the core and extending along the core, the conductive layer terminates before extending to the sidewall of the core; and
a plurality of first metal pillars extending from a first surface of the die, each pillar including:
a first dimension extending in a direction transverse to the first surface of the die, the first dimension being substantially equal to or greater than 20 micrometers (μm);
a support having a second surface; and
a first bonding material on the second surface coupling the plurality of first metal pillars to the second surface of the support.

2. The device according to claim 1, wherein the first dimension ranges from 20 μm to 150 μm.

3. The device according to claim 1, wherein the first dimension ranges from 50 μm to 100 μm.

4. The device according to claim 1, wherein the plurality of first metal pillars covers 30% to 50% of a surface area of the first surface of the die.

5. The device according to claim 1, wherein the plurality of first metal pillars include at least one of copper, silver, tin, and gold.

6. The device according to claim 1, wherein the plurality of first metal pillars include an alloy of tin and silver.

7. The device according to claim 1, wherein the first bonding material is an epoxy glue.

8. The die according to claim 1, wherein the first bonding material is a solder paste.

9. The device according to claim 1, wherein at least one end surface of one of the plurality of first metal pillars is spaced apart from the second surface of the support.

10. The device of claim 1, wherein at least one end surface of one of the plurality of first metal pillars is in contact with the second surface of the support.

11. The device according to claim 1, further comprising:
a second bonding material on a third surface of the first die opposite to the first surface of the first die; and
a second die on the third surface of the first die, the second die including a plurality of second metal pillars extending from a fourth surface of the second die, the plurality of second metal pillars extending into the second bonding material coupling the second die to the first die.

12. A device, comprising:
a support having a first surface;
a first bonding material on the first surface of the support;
a first die on the support, the die including:
a second surface;
a third surface opposite to the second surface;
a core between the second surface and the third surface, the core having a sidewall;
a conductive layer on the core and extending along the core, the conductive layer terminates before extending to the sidewall of the core; and
a first metal pillar extending from the second surface of the first die in a first direction transverse to the second surface of the first die, the first metal pillar having a first dimension in the first direction, the first pillar extending into the first bonding material; and
a gap extending from the second surface of the first die to the first bonding material, the gap having a second dimension extending in a second direction transverse to the first direction, the second dimension being greater than the first dimension.

13. The device of claim 12, wherein the bonding material is spaced apart from the second surface of the first die.

14. The device of claim 12, wherein the first die further includes a second metal pillar extending from the second surface of the first die in the first direction and being spaced apart from the first metal pillar, the second metal pillar having the first dimension, the second metal pillar extending into the first bonding material.

15. The device of claim 12, further comprising:
a second bonding material on the third surface of the first die; and
a second die on third surface of the first die, the second die including:
a fourth surface facing the first die; and
a second metal pillar extending from the fourth surface of the second die, the second metal pillar extends into the second bonding material,
wherein the first bonding material is spaced apart from the second surface of the first die and the second bonding material is spaced apart from the fourth surface of the second die.

16. A device, comprising:
a die including:
a core having a sidewall;
a conductive layer on the core and extending along the core, the conductive layer terminates before extending to the sidewall of the core, the conductive layer including a central region, a first corner region, a second corner region, a third corner region, and a fourth corner region, and the first, second, third, and fourth corner regions are spaced apart from each other; and a plurality of metal pillars extending from a surface of the die, each pillar including a first dimension extending in a direction transverse to the surface of the die, the plurality of metal pillars including:
- a first respective metal pillar within the central region;
- a second respective metal pillar within the first corner region;
- a third respective metal pillar within the second corner region;
- a fourth respective metal pillar within the third corner region; and
- a fifth respective metal pillar within the fourth corner region.

17. The device of claim 16, wherein the first dimension being substantially equal to or greater than 20 micrometers ($\mu m$).

18. The device of claim 16, wherein the first dimension ranges from 20 $\mu m$ to 150 $\mu m$.

19. The device of claim 16, wherein the plurality of metal pillars covers 30% to 50% of the surface of the die.

* * * * *